United States Patent
Fayneh et al.

(10) Patent No.: US 12,282,058 B2
(45) Date of Patent: Apr. 22, 2025

(54) INTEGRATED CIRCUIT PAD FAILURE DETECTION

(71) Applicant: PROTEANTECS LTD., Haifa (IL)

(72) Inventors: Eyal Fayneh, Givatayim (IL); Shai Cohen, Haifa (IL); Evelyn Landman, Haifa (IL); Yahel David, Kibbutz Gazit (IL); Inbar Weintrob, Givat-Ada (IL)

(73) Assignee: PROTEANTECS LTD., Haifa (IL)

( * ) Notice: Subject to any disclaimer, the term of this patent is extended or adjusted under 35 U.S.C. 154(b) by 96 days.

(21) Appl. No.: 17/866,615

(22) Filed: Jul. 18, 2022

(65) Prior Publication Data

US 2022/0349935 A1 Nov. 3, 2022

Related U.S. Application Data

(63) Continuation-in-part of application No. 16/765,997, filed as application No. PCT/IL2018/051267 on Nov. 22, 2018, now Pat. No. 11,391,771.

(60) Provisional application No. 62/590,308, filed on Nov. 23, 2017.

(51) Int. Cl.
   G01R 31/28 (2006.01)
   G04F 10/00 (2006.01)

(52) U.S. Cl.
   CPC ..... *G01R 31/2879* (2013.01); *G01R 31/2881* (2013.01); *G04F 10/005* (2013.01)

(58) Field of Classification Search
   CPC ............ G01R 31/2853; G01R 31/2884; G04F 10/005; G04F 10/00
   USPC ........................ 324/762.02, 762.01, 537, 500
   See application file for complete search history.

(56) References Cited

U.S. PATENT DOCUMENTS

| | | |
|---|---|---|
| 4,555,663 A | 11/1985 | Shimizu |
| 5,548,539 A | 8/1996 | Vlach et al. |
| 5,748,509 A | 5/1998 | Fewster |
| 5,774,403 A | 6/1998 | Clark, II et al. |
| 5,818,251 A | 10/1998 | Intrater |
| 5,895,629 A | 4/1999 | Russell et al. |
| 5,956,497 A | 9/1999 | Ratzel et al. |
| 5,966,527 A | 10/1999 | Krivokapic et al. |

(Continued)

FOREIGN PATENT DOCUMENTS

| | | |
|---|---|---|
| CN | 1886668 A | 12/2006 |
| CN | 101014991 A | 8/2007 |

(Continued)

OTHER PUBLICATIONS

Kan Takeuchi et al; "FEOL/BEOL wear-out estimator using stress-to-frequency conversion of voltage/temperature-sensitive ring oscillators for 28nm automotive MCUs"; ESSCIRC Conference 2016: 42nd European Solid-State Circuits Conference, 2016, pp. 265-268, doi: 10.1109/ESSCIRC.2016.7598293.

(Continued)

*Primary Examiner* — Giovanni Astacio-Oquendo
(74) *Attorney, Agent, or Firm* — The Roy Gross Law Firm, LLC; Roy D. Gross

(57) ABSTRACT

A semiconductor integrated circuit (IC) comprising a time-to-digital converter (TDC) configured to measure an input-to-output delay of an I/O buffer of a pad the IC, the measured delay reflecting a connection impedance of the pad. A circuit in the IC, or a computer in communication with the IC, determines electrical connection integrity of the pad based on the measured delay of the I/O buffer.

22 Claims, 12 Drawing Sheets

(56) References Cited

U.S. PATENT DOCUMENTS

| | | |
|---|---|---|
| 6,172,546 B1 | 1/2001 | Liu et al. |
| 6,182,253 B1 | 1/2001 | Lawrence et al. |
| 6,486,716 B1 | 11/2002 | Minami |
| 6,586,921 B1 | 7/2003 | Sunter |
| 6,683,484 B1 | 1/2004 | Kueng et al. |
| 6,807,503 B2 | 10/2004 | Ye et al. |
| 6,873,926 B1 | 3/2005 | Diab |
| 6,882,172 B1 | 4/2005 | Suzuki et al. |
| 6,948,388 B1 | 9/2005 | Clayton et al. |
| 7,038,483 B1 | 5/2006 | Suzuki et al. |
| 7,067,335 B2 | 6/2006 | Weiner et al. |
| 7,254,507 B2 | 8/2007 | Dosho et al. |
| 7,288,958 B2 | 10/2007 | Takagi |
| 7,369,893 B2 | 5/2008 | Gunderson |
| 7,443,189 B2 | 10/2008 | Ramappa |
| 7,455,450 B2 | 11/2008 | Liu et al. |
| 7,501,832 B2 | 3/2009 | Spuhler |
| 7,649,373 B2 | 1/2010 | Tokunaga |
| 7,701,246 B1 | 4/2010 | Plants et al. |
| 7,818,601 B2 | 10/2010 | LaBerge |
| 7,877,657 B1 | 1/2011 | Miller et al. |
| 7,940,862 B2 | 5/2011 | Tanaka et al. |
| 8,001,512 B1 | 8/2011 | White |
| 8,086,978 B2 | 12/2011 | Zhang et al. |
| 8,170,067 B2 | 5/2012 | Zerbe et al. |
| 8,279,976 B2 | 10/2012 | Lin et al. |
| 8,310,265 B2 | 11/2012 | Zjajo et al. |
| 8,365,115 B2 | 1/2013 | Liu et al. |
| 8,418,103 B2 | 4/2013 | Wang et al. |
| 8,479,130 B1 | 7/2013 | Zhang et al. |
| 8,633,722 B1 | 1/2014 | Lai |
| 8,825,158 B2 | 9/2014 | Swerdlow |
| 8,996,937 B2 | 3/2015 | Jain et al. |
| 9,275,706 B2 | 3/2016 | Tam |
| 9,424,952 B1 | 8/2016 | Seok et al. |
| 9,536,038 B1 | 1/2017 | Quinton et al. |
| 9,564,883 B1 | 2/2017 | Quinton et al. |
| 9,564,884 B1 | 2/2017 | Quinton et al. |
| 9,632,126 B2 | 4/2017 | Yoon |
| 9,714,966 B2 | 7/2017 | Chen et al. |
| 9,760,672 B1 | 9/2017 | Taneja et al. |
| 9,791,834 B1 | 10/2017 | Nassar et al. |
| 9,954,455 B2 | 4/2018 | Lin et al. |
| 9,977,078 B2 | 5/2018 | Loke et al. |
| 9,991,879 B2 | 6/2018 | Huang |
| 10,490,547 B1 | 11/2019 | Ali et al. |
| 10,509,104 B1 | 12/2019 | Dato |
| 10,530,347 B2 | 1/2020 | Tang |
| 11,036,266 B2 | 6/2021 | Srivastava et al. |
| 11,081,193 B1 | 8/2021 | Tang |
| 11,409,323 B2 | 8/2022 | Herberholz et al. |
| 11,768,235 B2 * | 9/2023 | Hsieh ............... G01R 31/2853 324/750.01 |
| 12,013,800 B1 | 6/2024 | Fayneh et al. |
| 2001/0013111 A1 | 8/2001 | Bishop et al. |
| 2004/0009616 A1 | 1/2004 | Huisman et al. |
| 2004/0015793 A1 | 1/2004 | Saxena et al. |
| 2004/0230385 A1 | 11/2004 | Bechhoefer |
| 2004/0230396 A1 | 11/2004 | Ye |
| 2004/0267479 A1 | 12/2004 | Querbach et al. |
| 2005/0053162 A1 | 3/2005 | Goishi |
| 2005/0104175 A1 | 5/2005 | Itano et al. |
| 2005/0114056 A1 | 5/2005 | Patel et al. |
| 2005/0134350 A1 | 6/2005 | Huang et al. |
| 2005/0134394 A1 | 6/2005 | Liu |
| 2005/0154552 A1 | 7/2005 | Stroud et al. |
| 2005/0193302 A1 | 9/2005 | Arguelles et al. |
| 2005/0285646 A1 | 12/2005 | Rashid |
| 2006/0049886 A1 | 3/2006 | Agostinelli, Jr. et al. |
| 2006/0224374 A1 | 10/2006 | Kwon et al. |
| 2007/0110199 A1 | 5/2007 | Momtaz et al. |
| 2007/0182456 A1 | 8/2007 | Agarwal et al. |
| 2007/0288183 A1 | 12/2007 | Bulkes et al. |
| 2008/0071489 A1 | 3/2008 | Wissel |
| 2008/0074521 A1 | 3/2008 | Olsen |
| 2008/0144243 A1 | 6/2008 | Mariani |
| 2008/0147355 A1 | 6/2008 | Fields et al. |
| 2008/0183409 A1 | 7/2008 | Roberts |
| 2008/0186001 A1 | 8/2008 | Singh et al. |
| 2008/0186044 A1 | 8/2008 | Singh |
| 2008/0216033 A1 | 9/2008 | Bucossi et al. |
| 2008/0231310 A1 | 9/2008 | Vijayaraghavan et al. |
| 2008/0262769 A1 | 10/2008 | Kadosh |
| 2009/0027077 A1 | 1/2009 | Vijayaraghavan |
| 2009/0044160 A1 | 2/2009 | Bueti et al. |
| 2009/0076753 A1 | 3/2009 | Vijayaraghavan |
| 2009/0096495 A1 | 4/2009 | Keigo |
| 2009/0105978 A1 | 4/2009 | Schuttert et al. |
| 2009/0183043 A1 | 7/2009 | Niwa |
| 2009/0222775 A1 | 9/2009 | Idgunji et al. |
| 2009/0230947 A1 | 9/2009 | Sumita |
| 2009/0244998 A1 | 10/2009 | Kim |
| 2009/0273550 A1 | 11/2009 | Vieri et al. |
| 2009/0278576 A1 | 11/2009 | Chakravarty |
| 2009/0306953 A1 | 12/2009 | Liu et al. |
| 2010/0153896 A1 | 6/2010 | Sewall et al. |
| 2010/0251046 A1 | 9/2010 | Mizuno et al. |
| 2010/0253382 A1 | 10/2010 | Wang et al. |
| 2011/0093830 A1 | 4/2011 | Chen et al. |
| 2011/0102091 A1 | 5/2011 | Yeric |
| 2011/0109377 A1 | 5/2011 | Fujibe |
| 2011/0113298 A1 | 5/2011 | Van Den Eijnden |
| 2011/0169537 A1 | 7/2011 | Ma |
| 2011/0175658 A1 | 7/2011 | Nomura |
| 2011/0187433 A1 * | 8/2011 | Baumann ............... H03L 7/0814 327/276 |
| 2011/0267096 A1 | 11/2011 | Chlipala |
| 2011/0295403 A1 | 12/2011 | Higuchi et al. |
| 2011/0315986 A1 | 12/2011 | Kaneda et al. |
| 2012/0025846 A1 | 2/2012 | Minas et al. |
| 2012/0038388 A1 | 2/2012 | Tseng et al. |
| 2012/0051395 A1 | 3/2012 | Chen et al. |
| 2012/0063524 A1 | 3/2012 | Stott et al. |
| 2012/0074973 A1 | 3/2012 | Baldwin et al. |
| 2012/0163074 A1 | 6/2012 | Franca-Neto et al. |
| 2012/0170616 A1 | 7/2012 | Tsai et al. |
| 2012/0187991 A1 | 7/2012 | Sathe |
| 2012/0212246 A1 | 8/2012 | Benjamin et al. |
| 2012/0217976 A1 | 8/2012 | Clarkson |
| 2012/0221906 A1 | 8/2012 | Shetty et al. |
| 2012/0242490 A1 | 9/2012 | Ramaswami |
| 2013/0088256 A1 | 4/2013 | Chlipala et al. |
| 2013/0226491 A1 | 8/2013 | Miguelanez, II |
| 2013/0241690 A1 | 9/2013 | Wallace et al. |
| 2013/0293270 A1 | 11/2013 | Lee et al. |
| 2013/0335875 A1 | 12/2013 | Baumann |
| 2014/0132293 A1 | 5/2014 | Abadir |
| 2014/0132315 A1 | 5/2014 | Sharma et al. |
| 2014/0143586 A1 | 5/2014 | Dalumi et al. |
| 2014/0184243 A1 | 7/2014 | Iyer et al. |
| 2014/0254734 A1 | 9/2014 | Abdelmoneum |
| 2015/0061707 A1 | 3/2015 | Balasubramanian et al. |
| 2015/0061721 A1 | 3/2015 | Jeong |
| 2015/0077136 A1 | 3/2015 | Li |
| 2015/0121158 A1 | 4/2015 | Wang et al. |
| 2015/0199223 A1 | 7/2015 | Banerjee et al. |
| 2015/0332451 A1 | 11/2015 | Amzaleg |
| 2015/0355033 A1 | 12/2015 | Zhang et al. |
| 2015/0365049 A1 | 12/2015 | Ozawa |
| 2016/0033574 A1 | 2/2016 | Serrer et al. |
| 2016/0042784 A1 | 2/2016 | Rim et al. |
| 2016/0072511 A1 | 3/2016 | Maekawa |
| 2016/0087643 A1 | 3/2016 | Nozaki |
| 2016/0125434 A1 | 5/2016 | Kohn et al. |
| 2016/0131708 A1 | 5/2016 | Huang et al. |
| 2016/0153840 A1 | 6/2016 | Huang et al. |
| 2016/0156176 A1 | 6/2016 | Kunz, Jr. |
| 2016/0164503 A1 | 6/2016 | Kim |
| 2016/0203036 A1 | 7/2016 | Mezic et al. |
| 2016/0254804 A1 | 9/2016 | Meng |
| 2017/0038265 A1 | 2/2017 | Abdelmoneum et al. |
| 2017/0093399 A1 | 3/2017 | Atkinson et al. |
| 2017/0160339 A1 | 6/2017 | Jenkins |
| 2017/0179173 A1 | 6/2017 | Mandai et al. |

(56) References Cited

U.S. PATENT DOCUMENTS

| | | |
|---|---|---|
| 2017/0199089 A1 | 7/2017 | Fritchman et al. |
| 2017/0199228 A1 | 7/2017 | Hsieh et al. |
| 2017/0214516 A1 | 7/2017 | Rivaud et al. |
| 2017/0329391 A1 | 11/2017 | Jaffari |
| 2017/0344102 A1 | 11/2017 | Kolla |
| 2017/0345490 A1 | 11/2017 | Yoshimoto et al. |
| 2017/0364818 A1 | 12/2017 | Wu et al. |
| 2018/0034549 A1 | 2/2018 | Kikuchi |
| 2018/0109245 A1 | 4/2018 | Takagi |
| 2018/0183413 A1 | 6/2018 | Wong |
| 2018/0365974 A1 | 12/2018 | Haas et al. |
| 2019/0019096 A1 | 1/2019 | Yoshida et al. |
| 2019/0117122 A1 | 4/2019 | Kurachi et al. |
| 2019/0128961 A1* | 5/2019 | Heron .................... G01R 31/30 |
| 2019/0162783 A1 | 5/2019 | Huang |
| 2019/0305074 A1 | 10/2019 | Kande et al. |
| 2020/0028514 A1 | 1/2020 | Hanke |
| 2020/0203333 A1 | 6/2020 | Chen et al. |
| 2020/0209070 A1 | 7/2020 | Tang et al. |
| 2020/0309850 A1* | 10/2020 | Bismuth ............ G01R 31/2891 |
| 2020/0313664 A1 | 10/2020 | Azam et al. |
| 2021/0325455 A1 | 10/2021 | Fayneh et al. |
| 2021/0341535 A1* | 11/2021 | Hsieh ................ G01R 31/2884 |
| 2022/0260630 A1 | 8/2022 | Fayneh et al. |
| 2022/0365135 A1* | 11/2022 | Faure ............... G01R 31/31725 |
| 2023/0098071 A1 | 3/2023 | Chonnad et al. |
| 2023/0333160 A1* | 10/2023 | Kim ................... G01R 31/3177 |

FOREIGN PATENT DOCUMENTS

| | | |
|---|---|---|
| CN | 101241429 A | 8/2008 |
| CN | 101344898 A | 1/2009 |
| CN | 101915625 B | 7/2012 |
| CN | 102273077 B | 9/2014 |
| CN | 102422169 A | 11/2014 |
| CN | 105210188 A | 12/2015 |
| CN | 106959400 A | 7/2017 |
| CN | 108534866 A | 9/2018 |
| CN | 113466670 A | 10/2021 |
| DE | 102007002253 A1 | 7/2007 |
| DE | 102014216786 B3 | 10/2015 |
| DE | 102012219971 A1 | 7/2016 |
| EP | 962991 A1 | 12/1999 |
| EP | 1262755 A1 | 12/2002 |
| EP | 2006784 A1 | 12/2008 |
| EP | 2060924 A1 | 5/2009 |
| EP | 2413150 A1 | 2/2012 |
| EP | 2770313 A1 | 8/2014 |
| JP | S57116228 A | 7/1982 |
| JP | 2000215693 A | 8/2000 |
| JP | 2002243800 A | 8/2002 |
| JP | 2008147245 A | 6/2008 |
| JP | 2009065533 A | 3/2009 |
| JP | 2009074921 A | 4/2009 |
| JP | 2011204328 A | 10/2011 |
| JP | 2012037238 A | 2/2012 |
| JP | 2012088322 A | 5/2012 |
| JP | 2009021348 A | 7/2013 |
| JP | 2014085348 A | 5/2014 |
| JP | 2016111563 A | 6/2016 |
| KR | 101232207 B1 | 2/2013 |
| KR | 2013110989 A | 10/2013 |
| TW | 200914841 A | 4/2009 |
| TW | 201614256 A | 3/2016 |
| TW | 201709669 A | 3/2017 |
| WO | 2005080099 A1 | 9/2005 |
| WO | 2013070218 A1 | 5/2013 |
| WO | 2013027739 A1 | 3/2015 |
| WO | 2019097516 A1 | 5/2019 |
| WO | 2019102467 A1 | 5/2019 |
| WO | 2019135247 A1 | 7/2019 |
| WO | 2019202595 A1 | 10/2019 |
| WO | 2019244154 A1 | 12/2019 |
| WO | 2020141516 A1 | 7/2020 |
| WO | 2020230130 A1 | 11/2020 |
| WO | 2021019539 A1 | 2/2021 |
| WO | 2021111444 A1 | 6/2021 |
| WO | 2021214562 A1 | 10/2021 |
| WO | 2022/009199 A1 | 1/2022 |
| WO | 2022215076 A1 | 10/2022 |
| WO | 2023238128 A1 | 12/2023 |
| WO | 2024/166103 A1 | 8/2024 |

OTHER PUBLICATIONS

Kan Takeuchi et al; "Wear-out stress monitor utilising temperature and voltage sensitive ring oscillators" IET Circuits, Devices & Systems. vol. 12 No. 2, pp. 182-188, Jan. 15, 2018. Retrieved Oct. 7, 2021; doi: 10.1049/iet-cds.2017.0153.

Kan Takeuchi et al; "Experimental Implementation of 8.9Kgate Stress Monitor in 28nm MCU along with Safety Software Library for IoT Device Maintenance"; IEEE International Reliability Physics Symposium (IRPS). Mar. 31, 2019.

Paulheim H & Meusel R. "A decomposition of the outlier detection problem into a set of supervised learning problems", Machine Learning, Sep. 2015, vol. 100 Issue 2, pp. 509-531; Retrieved Oct. 7, 2021; DOI 10.1007/s10994-015-5507-y.

Zhang L., Marron U.S., Shen, H., & Zhu,Z., "Singular value decomposition and its visualization", Journal of Computational and Graphical Statistics, Dec. 2007, vol. 6 Issue 4, pp. 833-854; DOI: 10.1198/106186007X256080.

Shinkai, Ken-ichi et al. "Device-parameter estimation with on-chip variation sensors considering random variability."; In 16th Asia and South Pacific Design Automation Conference (ASP-DAC 2011), pp. 683-688. IEEE, Jan. 25, 2011. Retrieved Oct. 7, 2021 from: https://citeseerx.ist.psu.edu/viewdoc/download?doi=10.1.1.188.2030&rep=rep1&type=pdf.

Weiwei Shan et al. "An improved timing error prediction monitor for wide adaptive frequency scaling"; IEICE Electronics Express, vol. 14, No. 21, pp. 1-6, Oct. 20, 2017; Retrieved Oct. 7, 2021; DOI: 10.1587/elex. 14.20170808.

Agilent Technologies; "Clock Jitter Analysis with femto-second resolution"; Jan. 1, 2008.

Yousuke Miyake et al; "Temperature and voltage estimation using ring-oscillator-based monitor for field test"; IEEE 23rd Asian Test Symposium; pp. 156-161, Nov. 16, 2014. Retrieved Oct. 7, 2021; DOI 10.1109/ATS.2014.38.

Basab Datta at al.; "Analysis of a Ring Oscillator Based on Chip Thermal Sensor in 65nm Technology"; Online at: https://web.archive.org/web/20140328234617/http://www-unix.ecs.umass.edu/~dkumar/lab4_658_report/lab4_report.htm; Sep. 5, 2018.

Tilman Wolf et al.; "Collaborative Monitors for Embedded System Security". Jan. 1, 2006. First Workshop on Embedded System Security in conjunction with EMSOFT'06, Oct. 26, 2006, Seoul, South Korea.

Sandeep, Kumar Samal et al. ; "Machine Learning Based Variation Modeling and Optimization for 3D ICs"; J. Inf. Commun. Converg. Eng. 14(4): 258-267, Dec. 2016. Retrieved Oct. 7, 2021; DOI: 10.6109/jicce.2016.14.4.258.

Yin-Nien Chen et al; "Impacts of Work Function Variation and Line-Edge Roughness on TFET and FinFET Devices and 32-Bit CLA Circuits"; J. Low Power Electron. Appl. 2015, 5, 101-115. May 21, 2015. Retrieved Oct. 7, 2021; doi:10.3390/jlpea5020101.

Yong Zhao et al; "A Genetic Algorithm Based Remaining Lifetime Prediction for a VLIW Processor Employing Path Delay and IDDX Testing"; IEEE; Apr. 12, 2016.

Vivek S Nandakumar et al, "Statistical static timing analysis flow for transistor level macros in a microprocessor"; 2010, 11th International Symposium on Quality Electronic Design (ISQED), pp. 163-170, Mar. 22, 2010.

Jing Li et al, "Variation Estimation and Compensation Technique in Scaled LTPS TFT Circuits for Low-Power Low-Cost Applications"; IEEE Transactions on Computer-Aided Design of Integrated Circuits and Systems, vol. 28(1): 46-59, Jan. 1, 2009.

Xie Qing et al."Variation-Aware Joint Optimization of the Supply Voltage and Sleep Transistor Size for 7nm FinFET Technology"; 2014 IEEE 32nd international conference on computer design, pp. 380-385, Oct. 19, 2014.

(56) References Cited

OTHER PUBLICATIONS

Rebaud B et al ,"Timing slack monitoring under process and environmental variations: Application to a DSP performance optimization"; Microelectronics Journal vol. 42 Issue 5, pp. 718-732, Feb. 8, 2011.
Dierickx B et al, "Propagating variability from technology to system Level"; Physics of Semiconductor Devices, pp. 74-79, Dec. 16, 2007.
James P. Hofmeister et al: Ball Grid Array (BGA) Solder Joint Intermittency Detection: SJ BIST; IEEE Aerospace Conference. Mar. 1-8, 2008.
Dan Ernst et al; "Razor: A Low-Power Pipeline Based on Circuit-Level Timing Speculation"; Appears in the 36th Annual International Symposium on Microarchitecture (MICRO-36). Dec. 2003.
Dan Ernst et al; "Razor: Circuit-Level Correction of Timing Errors for Low-Power Operation"; IEEE Computer Society. Nov.-Dec. 2004.
International Search Report of PCT/IL2018/051267 Completed Feb. 26, 2019; Mailed Feb. 27, 2019 6 pages.
Written Opinion of PCT/IL2018/051267 Completed Feb. 26, 2019; Mailed Feb. 27, 2019 5 pages.
Zheng K., "A Comparison of Digital Droop Detection Techniques in ASAP7 FinFET"; Research Review. Sep. 2019.
Hongge Chen, "Novel Machine Learning Approaches for Modeling Variations in Semiconductor Manufacturing," Master thesis, Jun. 2017.
Mridul Agarwal et al, "Circuit Failure Prediction and Its Application to Transistor Aging"; 5th IEEE VLSI Test Symposium (VTS'07), pp. 277-286, May 6-10, 2007. doi: 10.1109/VTS.2007.22.
Keith A. Bowman et al, "Energy-Efficient and Metastability-Immune Resilient Circuits for Dynamic Variation Tolerance"; IEEE Journal of Solid-State Circuits vol. 44, Issue 1, pp. 49-63, Jan. 2009. doi: 10.1109/JSSC.2008.2007148.
Shidhartha Das et al, "A Self-Tuning DVS Processor Using Delay-Error Detection and Correction"; IEEE Journal of Solid-State Circuits; vol. 41, Issue 4, pp. 792-804, Apr. 2006. doi: 10.1109/JSSC.2006.870912.
Shidhartha Das et al, "RazorII: In Situ Error Detection and Correction for PVT and SER Tolerance" 2008 IEEE International Solid-State Circuits Conference—Digest of Technical Papers, Feb. 3-7, 2008. doi: 10.1109/JSSC.2008.2007145.
Ramyanshu Datta et al, "On-Chip Delay Measurement for Silicon Debug"; GLSVLSI '04: Proceedings of the 14th ACM Great Lakes symposium on VLSI; pp. 145-148, Apr. 26-28, 2004. https://doi.org/10.1145/988952.988988.
Alan Drake et al, "A Distributed Critical-Path Timing Monitor for a 65nm High-Performance Microprocessor"; 2007 IEEE International Solid-State Circuits Conference. Digest of Technical Papers; Feb. 11-15, 2007. doi: 10.1109/ISSCC.2007.373462.
Matthias Eireiner et al, "In-Situ Delay Characterization and Local Supply Voltage Adjustment for Compensation of Local Parametric Variations"; IEEE Journal of Solid-State Circuits; vol. 42, Issue 7, pp. 1583-1592, Jul. 2007. doi: 10.1109/JSSC.2007.896695.
Matthew Fojtik et al, "Bubble Razor: An architecture-independent approach to timing-error detection and correction"; 2012 IEEE International Solid-State Circuits Conference; Feb. 19-23, 2012. doi: 10.1109/ISSCC.2012.6177103.
Matthew Fojtik et al, "Bubble Razor: Eliminating Timing Margins in an ARM Cortex-M3 Processor in 45 nm CMOS Using Architecturally Independent Error Detection and Correction"; IEEE Journal of Solid-State Circuits; vol. 48, Issue 1, pp. 66-81, Jan. 2013. doi: 10.1109/JSSC.2012.2220912.
Piero Franco et al., "On-Line Delay Testing of Digital Circuits"; Proceedings of IEEE VLSI Test Symposium; Apr. 25-28, 1994. doi: 10.1109/VTEST.1994.292318.
V. Huard et al., "Adaptive Wearout Management with in-situ aging monitors"; 2014 IEEE International Reliability Physics Symposium; Jun. 1-5, 2014. pp. 6B.4.1-6B.4.11, doi: 10.1109/IRPS.2014.6861106.
Liangzhen Lai et al, "SlackProbe: A Flexible and Efficient In Situ Timing Slack Monitoring Methodology"; IEEE Transactions on Computer-Aided Design of Integrated Circuits and Systems; vol. 33, Issue 8, pp. 1168-1179, Aug. 2014. doi: 10.1109/TCAD.2014.2323195.
M. Saliva et al, "Digital Circuits Reliability with In-Situ Monitors in 28nm Fully Depleted SOI"; 2015 Design, Automation Mar. 9-13, 2015. doi: 10.7873/DATE.2015.0238.
Martin Wirnshofer et al, "A Variation-Aware Adaptive Voltage Scaling Technique based on In-Situ Delay Monitoring"; 14th IEEE International Symposium on Design and Diagnostics of Electronic Circuits and Systems; pp. 261-266, Apr. 13-15, 2011. doi: 10.1109/DDECS.2011.5783090.
Martin Wirnshofer et al, "An Energy-Efficient Supply Voltage Scheme using In-Situ Pre-Error Detection for on-the-fly Voltage Adaptation to PVT Variations"; 2011 International Symposium on Integrated Circuits; pp. 94-97, Dec. 12-14, 2011. doi: 10.1109/ISICir.2011.6131888.
Martin Wirnshofer et al, "On-line supply voltage scaling based on in situ delay monitoring to adapt for PVTA variations"; Journal of Circuits, Systems and Computers; vol. 21, No. 08, Mar. 7, 2012. doi: 10.1142/S0218126612400270.
S. Mhira et al, "Dynamic Adaptive Voltage Scaling in Automotive environment"; 2017 IEEE International Reliability Physics Symposium (IRPS); pp. 3A-4.1-3A-4.7, Apr. 2-6, 2017. doi: 10.1109/IRPS.2017.7936279.
A. Benhassain et al, "Early failure prediction by using in-situ monitors: Implementation and application results"; Online at: https://ceur-ws.org/Vol-1566/Paper6.pdf, Mar. 18, 2016.
Charles R. Lefurgy et al, "Active Management of Timing Guardband to Save Energy in POWER7"; 2011 44th Annual IEEE/ACM International Symposium on Microarchitecture (MICRO); pp. 1-11; Dec. 3-7, 2011.
C. R. Lefurgy et al., "Active Guardband Management in Power7+ to Save Energy and Maintain Reliability"; in IEEE Micro, vol. 33, No. 4, pp. 35-45, Jul.-Aug. 2013. doi: 10.1109/MM.2013.52.
B. Zandian et al, "Cross-layer resilience using wearout aware design flow"; 2011 IEEE/IFIP 41st International Conference on Dependable Systems & Networks (DSN), pp. 279-290, Jun. 27-30, 2011. doi: 10.1109/DSN.2011.5958226.
M. Cho et al., "Postsilicon Voltage Guard-Band Reduction in a 22 nm Graphics Execution Core Using Adaptive Voltage Scaling and Dynamic Power Gating"; in IEEE Journal of Solid-State Circuits, vol. 52, No. 1, pp. 50-63, Jan. 4, 2017. doi: 10.1109/JSSC.2016.2601319.
W. Shan et al., "Timing error prediction based adaptive voltage scaling for dynamic variation tolerance"; 2014 IEEE Asia Pacific Conference on Circuits and Systems (APCCAS), pp. 739-742, Nov. 17-20, 2014. doi: 10.1109/APCCAS.2014.7032887.
J. Li et al, "Robust and in-situ self-testing technique for monitoring device aging effects in pipeline circuits"; 2014 51st ACM/EDAC/IEEE Design Automation Conference (DAC), pp. 1-6, Jun. 1-5, 2014.
X. Shang et al., "A 0.44V-1.1V 9-transistor transition-detector and half-path error detection technique for low power applications"; 2017 IEEE Asian Solid-State Circuits Conference (A-SSCC), pp. 205-208, Nov. 6-8, 2017. doi: 10.1109/ASSCC.2017.8240252.
Liangzhen Lai et al, "Accurate and inexpensive performance monitoring for variability-aware systems"; 2014 19th Asia and South Pacific Design Automation Conference (ASP-DAC), pp. 467-473, Jan. 20-23, 2014. doi: 10.1109/ASPDAC.2014.6742935.
Martin Wirnshofer et al, "Adaptive voltage scaling by in-situ delay monitoring for an image processing circuit"; 2012 IEEE 15th International Symposium on Design and Diagnostics of Electronic Circuits & Systems (DDECS), pp. 205-208, Apr. 18-20, 2012. doi: 10.1109/DDECS.2012.6219058.
Youhua Shi et al, "Suspicious timing error prediction with in-cycle clock gating"; International Symposium on Quality Electronic Design (ISQED), pp. 335-340, Mar. 4-6, 2013. doi: 10.1109/ISQED.2013.6523631.
Youhua Shi et al, "In-situ timing monitoring methods for variation-resilient designs"; 2014 IEEE Asia Pacific Conference on Circuits

(56) References Cited

OTHER PUBLICATIONS and Systems (APCCAS), pp. 735-738, Nov. 17-20, 2014. doi: 10.1109/APCCAS.2014.7032886.

Jongho Kim et al., "Adaptive delay monitoring for wide voltage-range operation"; 2016 Design, Automation & Test in Europe Conference & Exhibition (Date), pp. 511-516, Mar. 14-18, 2016. DOI: 10.3850/9783981537079_0330.

Xiaobin Yuan et al., "Design Considerations for Reconfigurable Delay Circuit to Emulate System Critical Paths"; in IEEE Transactions on Very Large Scale Integration (VLSI) Systems, vol. 23, No. 11, pp. 2714-2718, Nov. 2015. doi: 10.1109/TVLSI.2014.2364785.

Jianfeng Zhang et al, "Parameter Variation Sensing and Estimation in Nanoscale Fabrics"; Journal of Parallel and Distributed Computing; vol. 74, Issue 6, pp. 2504-2511, Jun. 1, 2014. https://doi.org/10.1016/j.pdc.2013.08.005.

I. A. K. M. Mahfuzul et al., "Variation-sensitive monitor circuits for estimation of Die-to-Die process variation"; 2011 IEEE ICMTS International Conference on Microelectronic Test Structures, Amsterdam, Netherlands; pp. 153-157, Apr. 4-7, 2011. doi: 10.1109/ICMTS.2011.5976878.

Ying Qiao et al, "Variability-aware compact modeling and statistical circuit validation on SRAM test array"; Proceedings of the SPIE, vol. 9781, Design-Process-Technology Co-optimization for Manufacturability X, Mar. 16, 2016. DOI: 10.1117/12.2219428.

David Herres, "The Eye Diagram: What is it and why is it used?"; Online at: https://www.testandmeasurementtips.com/basics-eye-diagrams/, Aug. 16, 2016.

Yu-Chuan Lin et al, "A 10-GB/s Eye-Opening Monitor Circuit for Receiver Equalizer Adaptations in 65-nm CMOS;" in IEEE Transactions on Very Large Scale Integration (VLSI) Systems, vol. 28, No. 1, pp. 23-34, Jan. 2020. doi: 10.1109/TVLSI.2019.2935305.

Nidhal Selmane, Shivam Bhasin, Sylvain Guilley, Tarik Graba, Jean-Luc Danger. "WDDL is Protected Against Setup Time Violation Attacks." CHES, Sep. 2009, Lausanne, Switzerland. pp.73-83. Doi: 10.1109/FDTC.2009.40.

Nidhal Selmane, Shivam Bhasin, Sylvain Guilley, Jean-Luc Danger. "Security evaluation of application-specific integrated circuits and field programmable gate arrays against setup time violation attacks." IET Inf. Secur., 2011, vol. 5, Iss. 4, pp. 181-190. doi: 10.1049/iet-ifs.2010.0238.

\* cited by examiner

INTEGRATED CIRCUIT PAD FAILURE DETECTION

CROSS REFERENCE TO RELATED APPLICATIONS

This application is a continuation-in-part of U.S. patent application Ser. No. 16/765,997, filed May 21, 2020, entitled "Integrated Circuit Pad Failure Detection," which is a National Phase of PCT Patent Application No. PCT/IL2018/051267, filed Nov. 22, 2018, entitled "Integrated Circuit Pad Failure Detection," which claims the benefit of priority of U.S. Provisional Patent Application No. 62/590,308, filed Nov. 23, 2017. The contents of the above applications are all incorporated by reference as if fully set forth herein in their entirety.

FIELD OF THE INVENTION

The invention relates to the field of integrated circuits.

BACKGROUND

Integrated circuits (ICs) may include analog and digital electronic circuits on a flat semiconductor substrate, such as a silicon wafer. Microscopic transistors are printed onto the substrate using photolithography techniques to produce complex circuits of billions of transistors in a very small area, making modern electronic circuit design using ICs both low cost and high performance. ICs are produced in assembly lines of factories, termed foundries, that have commoditized the production of ICs, such as complementary metal-oxide-semiconductor (CMOS) ICs. Digital ICs contain billions of transistors arranged in functional and/or logical units on the wafer, and are packaged in a metal, plastic, glass, or ceramic casing. The casing, or package, is connected to a circuit board, such as by using solder. Types of packages may include a leadframe (though-hole, surface mount, chip-carrier, and/or the like), pin grid array, chip scale package, ball grid array, and/or the like, to connect between the IC pads and the circuit board. As used herein the term IC means the integrated circuit including the package.

The foregoing examples of the related art and limitations related therewith are intended to be illustrative and not exclusive. Other limitations of the related art will become apparent to those of skill in the art upon a reading of the specification and a study of the figures.

SUMMARY

The following embodiments and aspects thereof are described and illustrated in conjunction with systems, tools and methods which are meant to be exemplary and illustrative, not limiting in scope.

There is provided, in accordance with an embodiment, a semiconductor integrated circuit (IC) comprising a time-to-digital converter circuit (TDC, of any type), wherein time inputs to the TDC are (i) one or more input signals to an input/output (I/O) buffer of a pad of the IC, and (ii) one or more output from the I/O buffer. The IC comprises a digital comparator circuit electrically configured to: receive a stream of digital output values from the TDC, compare each value of the stream to one or more previous value in the stream, and when the comparison reflects a difference value greater than a threshold, issuing a notification. The threshold is determined by one or more from the group consisting of: (i) a predefined threshold, (ii) a threshold received from an external testing circuit during initial operation of the IC, (iii) a threshold calculated and stored during the initial operation of the IC over a period of time, (iv) a threshold that varies over time, and (v) a threshold that varies with respect to at least one environmental condition.

In some embodiments, the time inputs to the TDC are determined from the lower-half of I/O buffer voltage swing using one or more analog comparator circuits.

In some embodiments, the issuing is performed when the difference value is greater than the threshold for a specific number of instances.

In some embodiments, the issuing is performed when the difference value is greater than the threshold for a specific number of instances within a time window.

In embodiments, the IC may further comprise an impedance learner configured to receive a stream of digital output values from the TDC (in particular, during the initial operation of the IC) and to determine the threshold based on the stream received (during the initial operation). This may especially apply when the threshold is determined by (iii) a threshold calculated and stored during the initial operation of the IC over a period of time. In such embodiments, the impedance learner is optionally configured to determine the threshold by analysis of the received stream using at least one from the group consisting of: (a) a statistical estimator (such as a maximum likelihood estimator); (b) a machine learning algorithm; and (c) a confidence interval computation.

In some embodiments, the at least one environmental condition comprises at least one from the group consisting of: voltage; and temperature.

In some embodiments, the digital comparator circuit is implemented (by firmware/hardware/software) on a computerized server, wherein the computerized server is external to the IC.

The notification may be to one or more of the group consisting of: (i) a user of the IC; (ii) cause an alert that can be detected by the user of IC, in response to the notification (for example using an alert generating circuit configured for that purpose, the alert being audible, visual or detectable by interfacing with the IC in some way, such as via a communications interface); (iii) disable a part or a whole of the IC, in response to the notification (for instance through an IC disabling circuit configured for that purpose); and (iv) cause a lane remapping of at least part of the IC, in response to the notification (for instance through a lane remapping circuit and/or a computer program, i.e. software configured for that purpose).

There is provided, in accordance with an embodiment, a method for detecting disconnections of an IC pad, comprising using one or more hardware processors for receiving a stream of digital output values from a TDC. The hardware processor(s) are used for comparing each value of the stream to one or more previous value in the stream. The method may further comprise, when the comparison reflects a difference value greater than a threshold, issuing a notification. The inputs to the TDC are (i) one or more digital signals from to an input/output (I/O) buffer of a pad of the IC, and (ii) one or more digital outputs from the I/O buffer. The threshold is determined by one or more from the group consisting of: (i) a predefined threshold, (ii) a threshold received from an external testing circuit during initial operation of the IC, (iii) a threshold calculated and stored during the initial operation of the IC over a period of time, (iv) a threshold that varies over time, and (v) a threshold that varies with respect to at least one environmental condition. In such method embodiments, method steps may optionally be provided to include any of the features discussed with reference to the IC embodiment. In some embodiments, there may considered a computer readable medium, having instructions stored thereupon for carrying out any of the method embodiments disclosed herein, when said instructions are performed by a processor.

In addition to the exemplary aspects and embodiments described above, further aspects and embodiments will become apparent by reference to the figures and by study of the following detailed description. The skilled person will appreciate that combinations and sub-combinations of specific features disclosed herein may also be provided, even if not explicitly described.

BRIEF DESCRIPTION OF THE FIGURES

Exemplary embodiments are illustrated in referenced figures. Dimensions of components and features shown in the figures are generally chosen for convenience and clarity of presentation and are not necessarily shown to scale. The figures are listed below.

DETAILED DESCRIPTION

Figure 1:
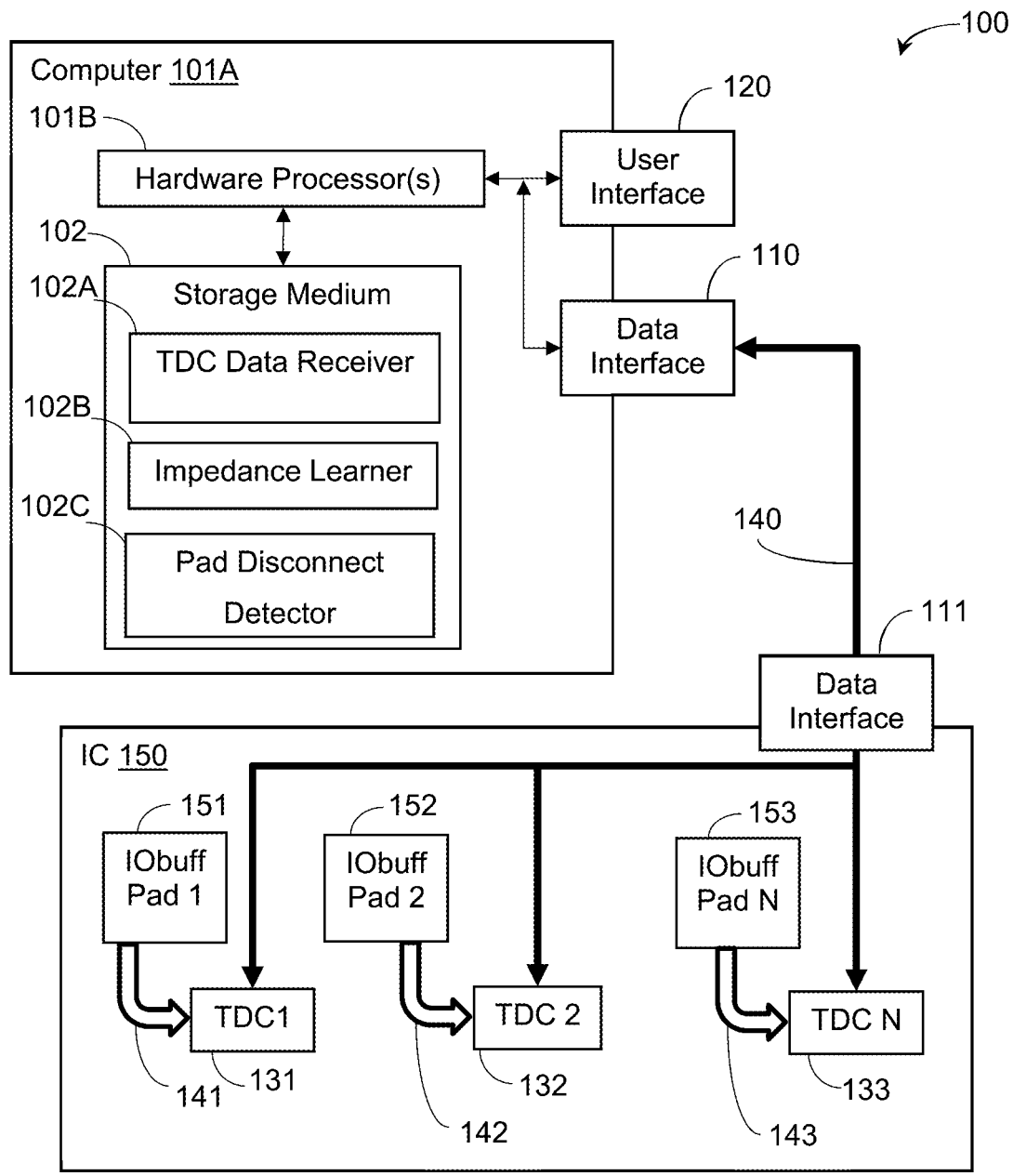
FIG. 1 shows schematically a computerized system for detecting IC pad integrity.

Disclosed herein are devices, systems, and methods to detect intermittent/instantaneous disconnections of an IC pad. By measuring the input to output (I/O) delay for each I/O buffer of an IC pad, the timing delay can be converted to a digital value that reflects the I/O pad connection impedance. When the I/O pad solder is intermittently, instantaneously, or partially disconnected, the I/O pad connection impedance is changed, and the I/O buffer delay is changed. By monitoring this delay, a circuit on the IC or an external processing system may determine that the I/O pad solder has been compromised. The delay is measured by a time-to-digital converter (TDC, of any type) circuit which gets 2 inputs: (i) I/O buffer input signal, and (ii) I/O buffer output signal, optionally each after an analog comparator circuit.

The TDC thereby produces a stream of outputs, each of which indicates a delay at a certain measurement time. One value in the stream is compared with at least one previous value (for example, the immediately preceding value in the stream, a number of immediately preceding values, or an average of a number of preceding values or immediately preceding values of the stream) to provide a difference value. The difference value is compared against a threshold, to determine if the difference value is greater than the threshold. Another option is to compare a value in the TDC output stream (optionally, multiple values, either successive values or values sampled at a predefined rate) with a certain threshold, without checking for a difference between the values themselves. In either case, the threshold may be: (i) a predefined threshold (that is, preset in the IC); (ii) a threshold received from an external testing circuit (especially during initial operation of the IC); (iii) a threshold calculated and stored during the initial operation of the IC over a period of time; (iv) a threshold that varies over time (which may be preset or dynamically adjusted, for example calculated and/or stored on the IC); and (v) a threshold that varies with respect to at least one environmental condition (such as temperature and/or voltage, which may be measured using a respective sensor or other device providing a signal indicative of the respective environmental condition). The threshold thereby allows identification of a potential (predicted) or actual (present) failure within the IC and/or of the IC pad.

Optionally, the analog comparator circuit compares the raw I/O buffer output signal to a certain threshold, such as a threshold at the lower-half of I/O buffer voltage swing. This may be done to filter reflections from the buffer impedance load that may affect the measured delay. The filtered signal at the analog comparator output may be clean from reflections, and the voltage swing may be equal to the voltage swing of the buffer input signal. The TDC may convert the instantaneous buffer delay into a digital readout. Any change in the buffer delay will be measured by the TDC based on the step-resolution which is an inverter-delay. As used herein, voltage swing means the difference of maximum output voltage and minimum output voltage.

Optionally, other data paths may be monitored for impedance changes by detecting changes in signal buffer delays.

Figure 2:
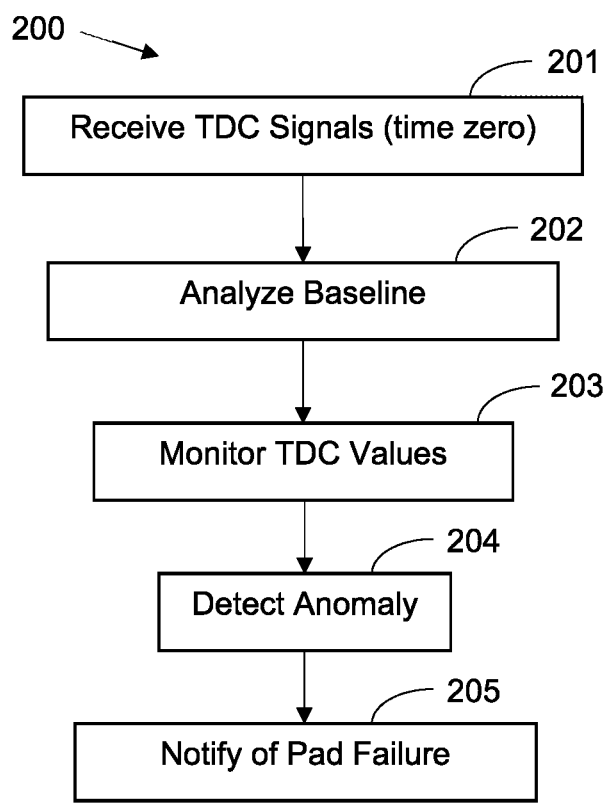
FIG. 2 shows a flowchart of a method for detecting IC pad integrity.

Reference is now made to FIG. 1 and FIG. 2, which show (i) schematically a computerized system 100 and (ii) a flowchart of method 200 a flow for detecting IC pad integrity. Computerized system 100 comprises an IC 150 with TDCs, such as 131, 132, 133, and/or the like, one each electrically connected (141, 42, 143, etc.) measuring the delay between the input and the output of an I/O buffer (151, 52, 153, etc.) connected to an IC pad. The digital time measurement values may be communicated over a data network 140, between a data interface 111 of IC 150 to a data interface 110 of a computer 101A. Computer 101A comprises one or more hardware processors 101B, a user interface 120, and a non-transitory, computer readable storage medium 102. Storage medium 102 has encoded thereon program code modules (102A, 102B, 102C, etc.) that when executed on hardware processor(s) 101B perform actions of method 200, such as 201, 202, 203, 304, 205, and/or the like. Optionally, the TDC values are received by a processing component (not shown) on the IC that performs the actions of method 200. For example, a TDC Data Receiver 102A receives 201 TDC values. For example, an Impedance Learner 102B analyzes the TDC values during an initial time period to determine a baseline behavior of the IC in operation. For example, TDC Data Receiver 102A and/or a Pad Disconnect Detector 102C monitor 203 TDC values and when an anomaly is detected 204, notify 205 of a pad failure, eminent failure, future failure, and/or the like.

Optionally, the anomalies are counted before a notification is issued.

Optionally, the anomalies are counted within a time window before a notification is issued.

Figure 3A:
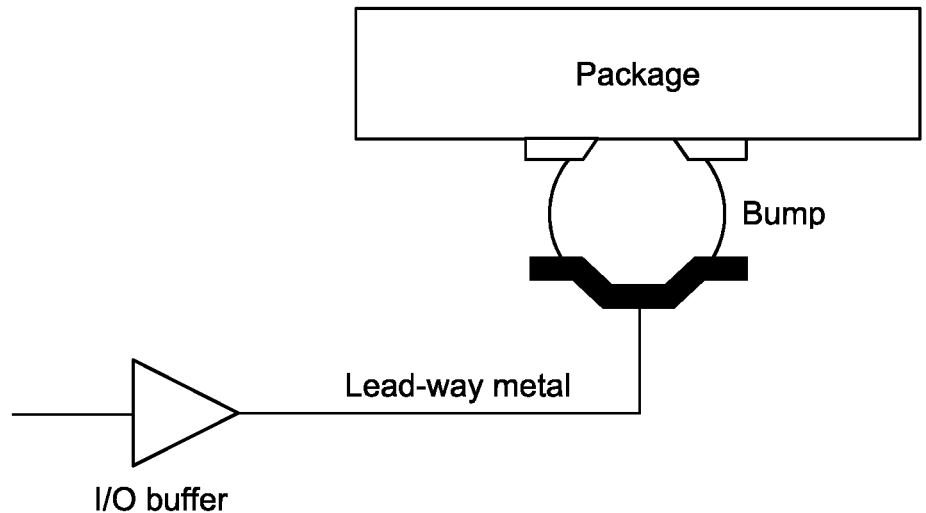
FIG. 3A shows schematically a solder bump of an IC pad.

Reference is now made to FIG. 3A, which shows schematically a solder bump of an IC pad. The I/O buffer may drive a the I/O of a flip chip pad, such as a controlled collapse chip connection (C4) bump connected to the pad. The C4 bump is an example of a common packaging technology, and in the general case, the invention is applicable to any package technology, or any chip-to-chip packaging technologies, such as 2.5D and/or 3D packaging technologies.

Optionally, electrically connection integrity is detected through one or more solder connections of an electronic package and/or circuit, such as micro-bumps, through-silicon via bumps, C4 bumps, package bumps (such as BGA balls), and/or the like.

Figure 3B:
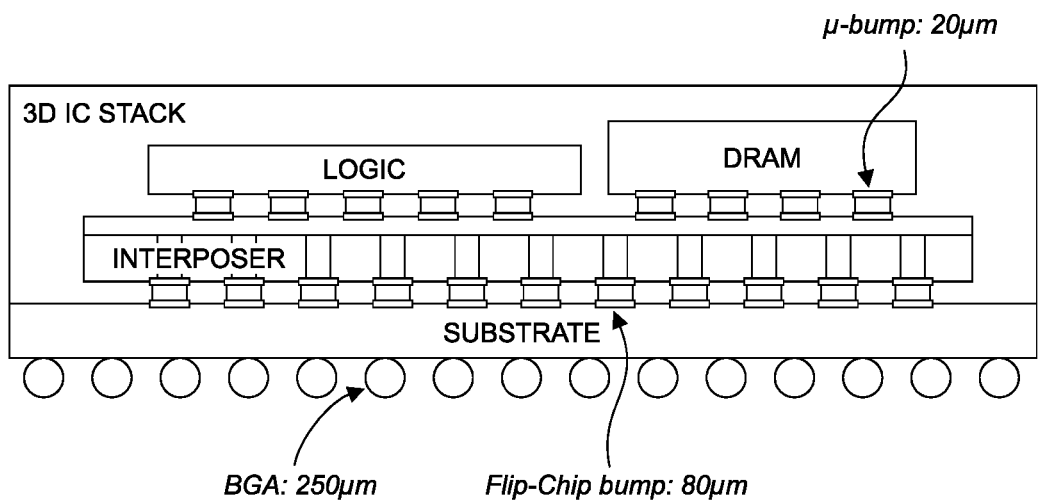
FIG. 3B shows schematically solder bumps of a 2.5D IC package.

Reference is now made to FIG. 3B, which shows solder bumps of a 2.5D IC package. Shown are some different levels of solder joints within an IC package, and between the IC package and the circuit board.

Figure 4:
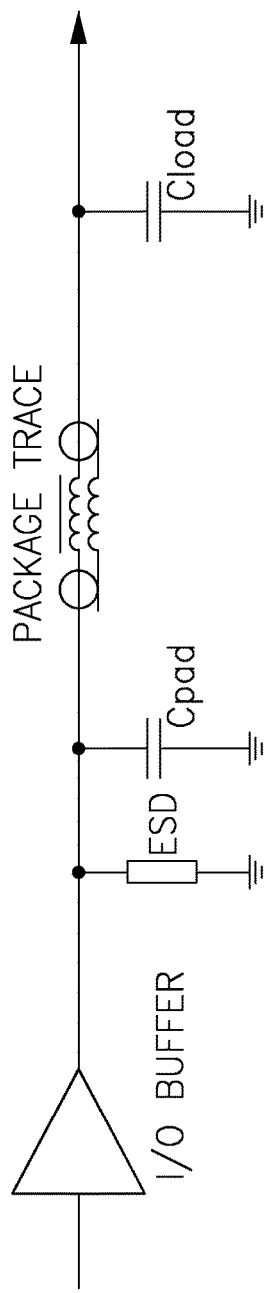
FIG. 4 shows an electrical schematic of a solder bump of an IC pad.

Reference is now made to FIG. 4, which shows an electrical schematic (equivalent circuit) of a solder bump of an IC pad. The electrical diagram shows an I/O buffer driving a pad with electrostatic discharge (ESD) protection circuits (such as including the capacitor Cpad), a package trace (represented by a transmission-line component), and a receiver load (represented by capacitor Cload). The delay of the I/O-buffer may depend on the total buffer output impedance, such as the resistance-inductance-capacitance (RLC) load of all electrical components connected to the I/O buffer. A mechanical change to the solder of the pad, such as a disconnection, may change the buffer output RLC impedance load.

Figure 5A:
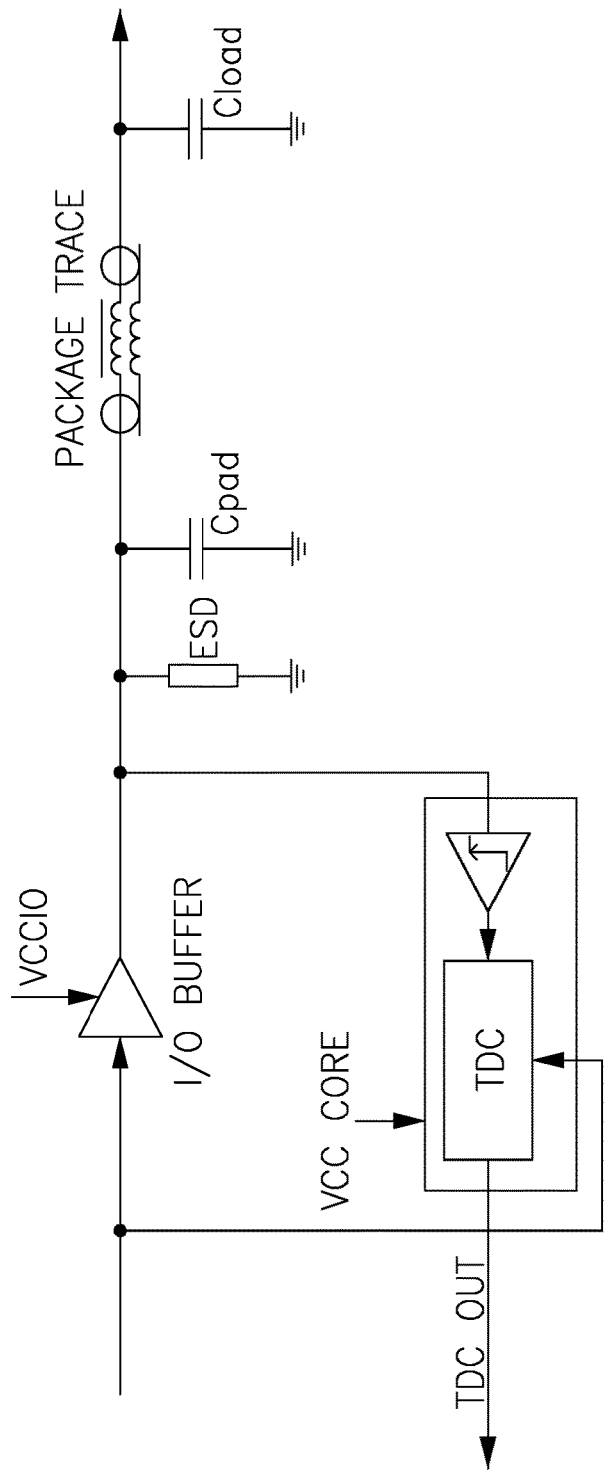
FIG. 5A shows an electrical schematic of a solder bump of an IC pad for detecting electrical connection integrity.

Reference is now made to FIG. 5A, which shows an electrical schematic of a solder bump of an IC pad for detecting integrity. The I/O buffer may generate a timing value, using the TDC, which reflects its input-to-output delay, which in turn may be a function of the RLC impedance load. The I/O buffer delay may be measured for each rising and falling edges of the signal reaching the I/O pad.

The TDC and processing circuit/computer may detect the output load change based on the following steps:
 a. Convert the measured I/O-buffer delay or each monitored pad into a digital value readout.
   i. Readout may be generated for each rising and/or falling transition.
   ii. Conversion accuracy may be 1-inversion-delay resolution, such as determined by a series connection of delay elements (diodes). For example, conversion from delay to digital is determined with a 1 picosecond (ps) accuracy. Delay accuracy and/or resolution may be between 1 femtosecond and 1 millisecond.
 b. Learn the behavior of the delay-trace over-time, such as using machine learning algorithms, local on IC post-processing logic, and/or the like.
 c. Detect a buffer delay change by comparing the buffer delay over-time to its own history and to the ongoing behavior of other buffers delays on this IC or other comparable ICs.

Figure 5B:
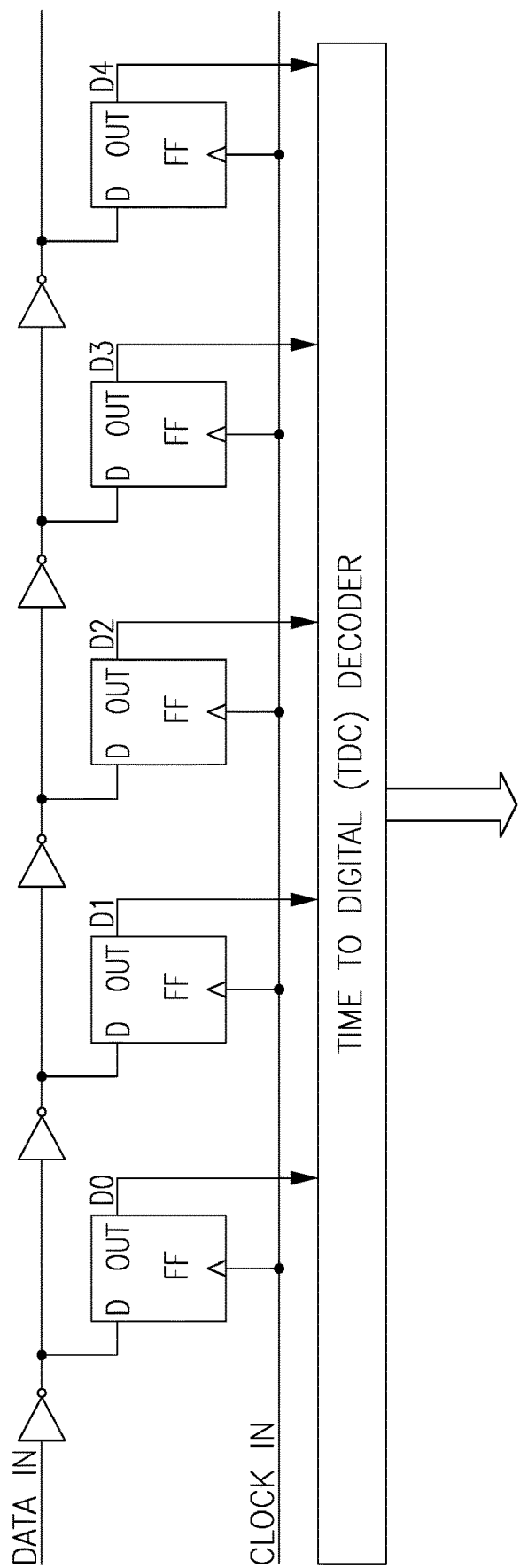
FIG. 5B shows an electrical schematic of a TDC.

Reference is now made to FIG. 5B, which shows an electrical schematic of a TDC. After each serial delay element, a storage device, such as a flipflop, records that (i.e., when) the signal reached that time delay, and then the decoder converts that delay to a digital value.

A detection circuit may determine that the delay value has passed a threshold. For example, a signal and noise model may be: $s=s_1(t)+s_2(t)+n(t)$, where $s_1(t)$ denotes the steady state deterministic signal (may be a single-tone), $s_2(t)$ denotes the event (bad) signal, and $n(t)$ denotes stochastic noise. The event may be $E=\{s_2(t)>\beta\}$. The objective (for a given $\delta$) may be to find a method $F[s(t)] \to 0, 1$ such that: $P(F[s(t)]=1, E^C)<\delta_1$ (false positive) ($E^c$ stands for the complementary of E) and $P(F[s(t)]=0, E)<\delta_2$ (false negative).

Figure 6A:
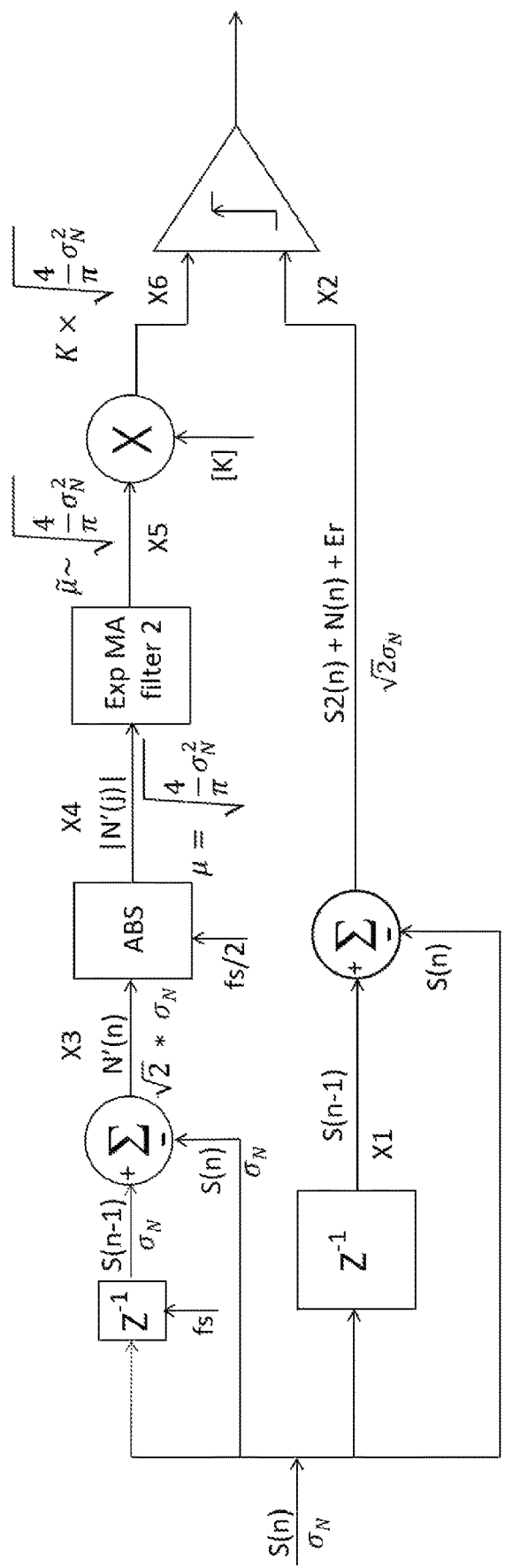
FIG. 6A shows an electrical schematic of a detection circuit for a solder bump with electrical connection integrity degradation.

Reference is now made to FIG. 6A, which shows an electrical schematic of a detection circuit for a solder bump with electrical connection integrity degradation.

The issues resulting from I/O pad disconnections may be critical in many electronic systems and/or circuits. The disconnections may be caused by many types of solder joint failure, such as mechanical stress, corrosion, heat stress, vibration, fatigue, and/or the like. Disconnection may be permanent or intermittent. Intermittent disconnection may occur when the pad is disconnected for a short period of time during operation.

The detection may be performed non-intrusively, such as while the device/system is fully operational (no need to stop the device from its operational work to perform any type of special testing). The mechanical pad-disconnection problem is converted to an electrical signal that may be detected by electrical circuits and post-processing methods. The technique is not sensitive to the pad location on the IC package or circuit, and may be used for one or more pads, up to the maximum number of pads on the IC.

These issues become critical in many applications, such as applications where cost of failure is high (such as autonomous vehicles), cost of replacement is high (such as satellite IC failure), cost of failure to product image is high (such as a resulting negative user experience is created by failure), and/or the like. An integrated circuit (IC) embodiment using the techniques disclosed herein, includes one or more I/O buffer delay measurement circuits, and a system (and/or on IC circuit) that may alert of delays indicating that a failure is about to occur or has occurred.

Intermittent failure on an IC may be fatal, especially if it happens in the field. In such a case, the system may fail due to loss (breaking) of signal integrity. For example, data or control may be lost, which will lead to a complete failure of at least part of the IC. As a result, immediate or prompt (within a predetermined time window) alerting and/or notification of an intermittent failure, once detected in the field, may be highly advantageous, since the consequences of such intermittent failure are not necessarily known. It may be difficult to reproduce an intermittent failure, since it is non-continuous by definition and it may be caused by a mechanical problem. A fix can be performed after stopping operation of the IC (offline), for instance by identifying and replacing a bad die. Disabling the IC represents another possible option for avoiding complete failure of the IC once an intermittent failure has been detected in this way.

In addition to providing a notification or alert or as an alternative to these options, it may be possible to take one or more online mitigation actions to reduce the likelihood of or repair an intermittent failure causing a persistent or complete failure of the IC. For example, this may include activating a software based "lane-repair" or "lane re-map" mechanism in the field. This mechanism may replace a lane with a failure (such a data path) with a spare lane.

Figure 6B:
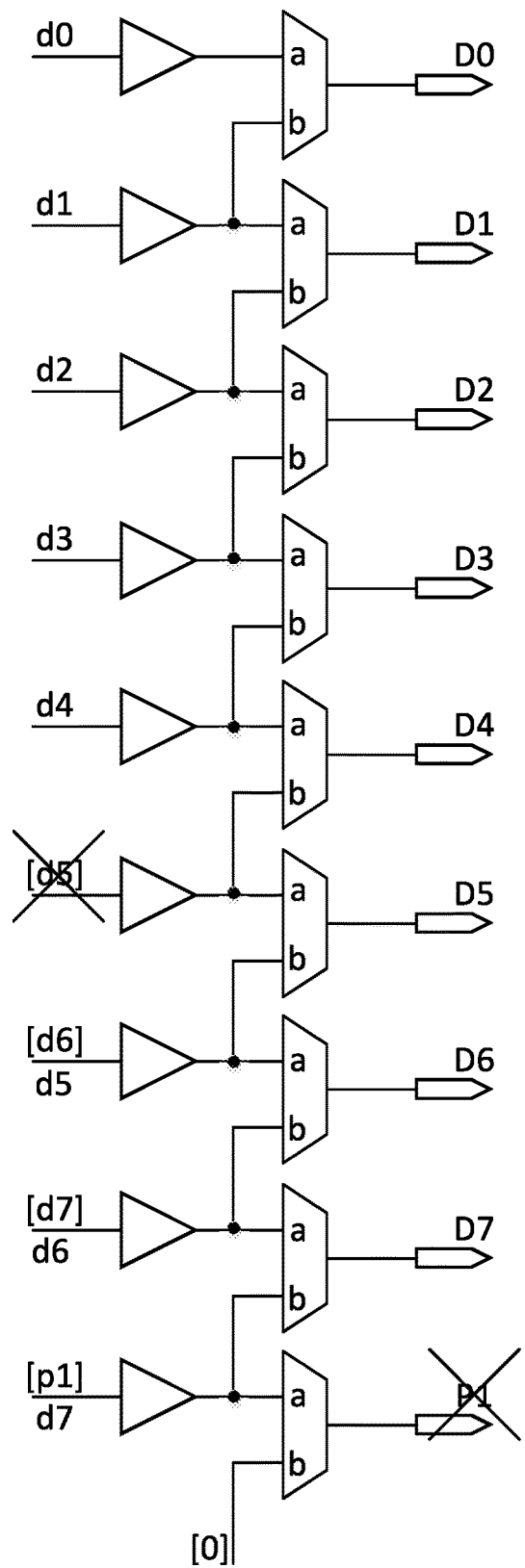
FIG. 6B shows an exemplary write data path for one byte of data, in which a failure occurs.

With reference to FIG. 6B, there is shown an exemplary write data path for one byte of data, in which one failure occurs. The circuit receiving the d5 signal has failed (indicated by the cross). The d5 signal is then remapped to the next circuit down (replacing the d6 signal), with consequent remapping to other circuits. Some signals may be lost in this remapping. In this example, the p1 signal is lost. This is a less important signal, but such a process allows keeping the functionality of the system, by inserting one or more important signals to replace at least one less important signal. The remapping process can be expanded to multiple bytes. For example, it may be possible to remap a failed important signal from BYTE 0 to a less important signal in BYTE 1.

The lane remapping may be by writing a register (soft) or by cutting an eFuse (hard). Although this has been illustrated in respect of a data write circuit, it will also be applicable to other types of circuits involving signals along a path, such as read circuits, memory circuits and data processing circuits. As shown by such examples, not only can a problem be indicated and debugged by the approach of the present disclosure, but also a solution to the problem may be possible.

EXPERIMENTAL RESULTS

Following are results of simulations of a detection circuit and I/O pad failures.

Figure 7:
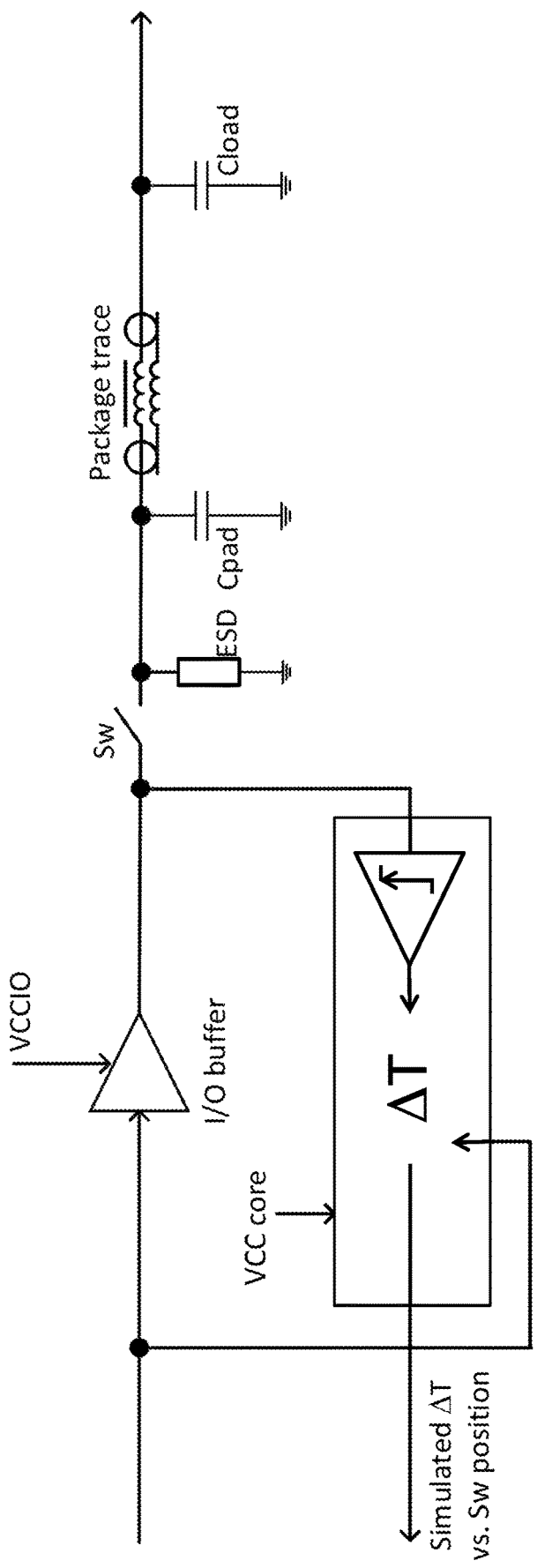
FIG. 7 shows an electrical schematic of a solder bump of an IC pad for simulating electrical connection integrity.

Reference is now made to FIG. 7, which shows an electrical schematic of a solder bump of an IC pad for simulating electrical connection integrity. FIG. 7 is similar to FIG. 5A, with the addition of a switch (sw) to simulate the electrical disconnection of a solder pad.

Figure 8A:
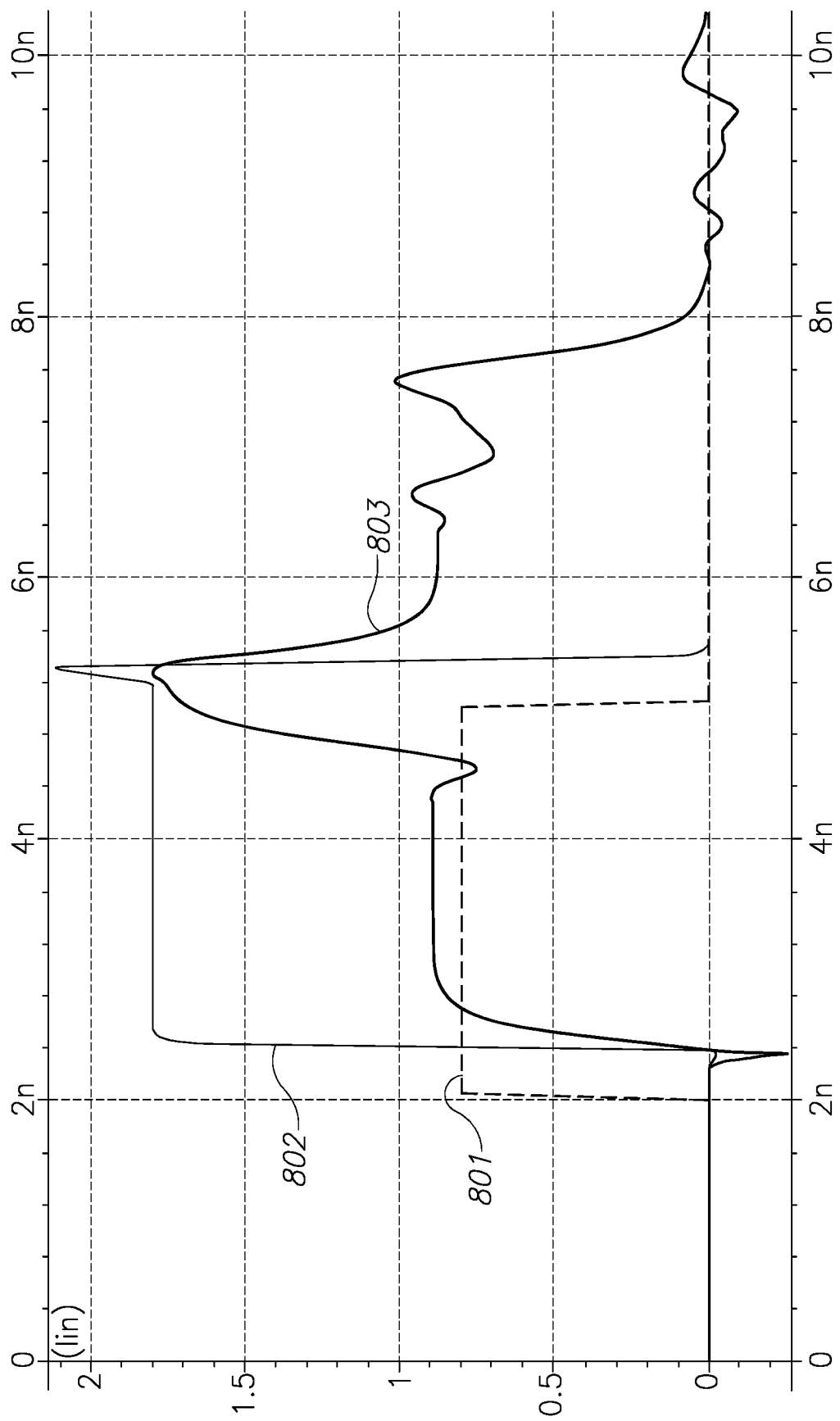
FIG. 8A shows a first oscilloscope screen of a first electrical timing delay simulation for detecting IC pad electrical connection integrity.
Figure 8B:
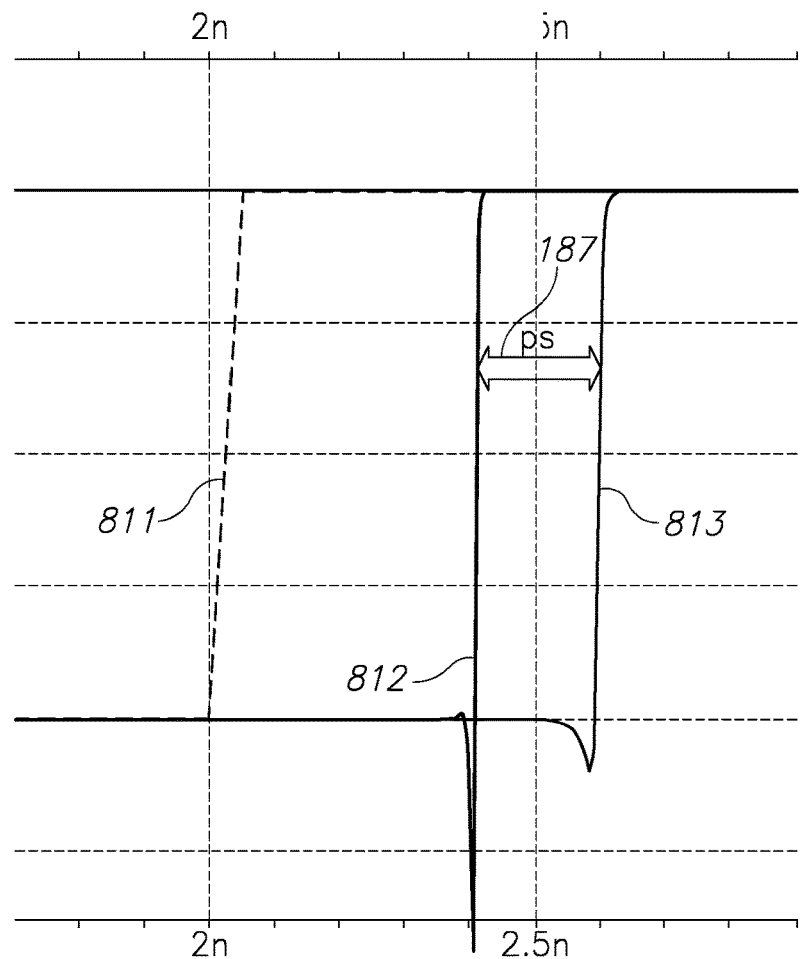
FIG. 8B shows a second oscilloscope screen of a second electrical timing delay simulation for detecting IC pad electrical connection integrity.

Reference is now made to FIG. 8A and FIG. 8B, which show a first and second oscilloscope screen of a first and second (respectively) electrical timing delay simulation for detecting IC pad integrity. An input signal 801 comprised a boxcar shape going from 0 to 0.8 at time equal to 2 nanoseconds (ns), and back to zero at 5 ns. A closed-switch signal 802 shows the delayed boxcar shape convolved with the impedance of the I/O buffer circuit. An open-switch signal 803 shows the changes as a result of a pad disconnection, including a slightly increased delay. FIG. 8B shows a close-up time scale of the delay between input signal 811, a closed-switch signal 812, and an open-switch signal 813, showing a 187 ps increase in delay time.

Figure 9:
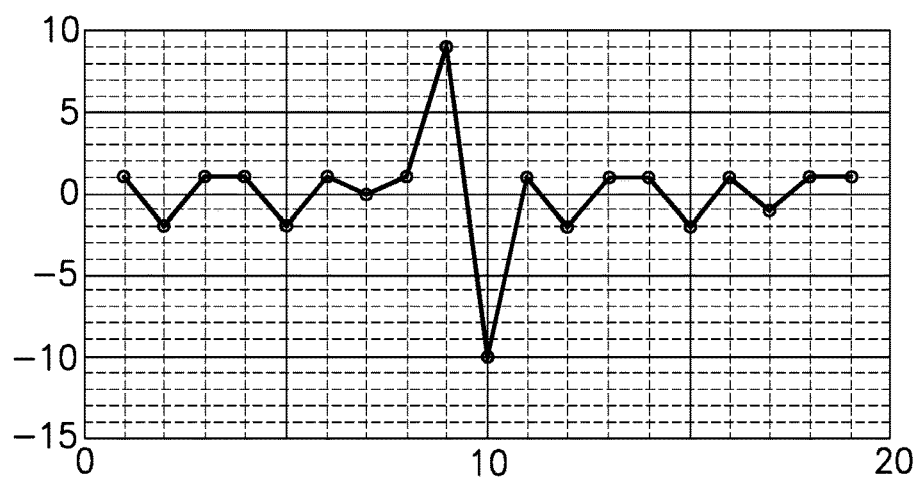
FIG. 9 shows a graph of electrical timing delay simulation for detecting IC pad electrical connection integrity.

Reference is now made to FIG. 9, which shows a graph of electrical timing delay simulation for detecting IC pad integrity. The graph of FIG. 9 represents the derivative of the TDC output ($x[n]-x[n-1]$) for a certain delay signal. The values are centered around zero (with some amount of noise), and when the intermittent failure occurs the delay increased, and then decreased sharply. A pad-disconnection is simulated at n=9, and the result was a significant jump of the TDC readout and the derivative. In this example, the simulated buffer delay change was approximately 200 picosecond (ps) and the TDC step was 20 ps. Applying a threshold detection circuit/module may detect this anomaly and alert/notify the appropriate entity to take necessary actions.

The digital output of the TDC was post-processed using a maximum likelihood (ML) algorithm that learned the buffer delay and its derivative over-time. A threshold from the ML analysis may represent a good behavior based on the specific IC history and the behavior of other buffers of that IC and comparable ICs. The post-processing may be performed also by a local logic circuit on the IC. Part of the post-processing may be noise cancelation to increase the signal-to-noise of the TDC digital value signal (i.e. vector).

Figure 10A:
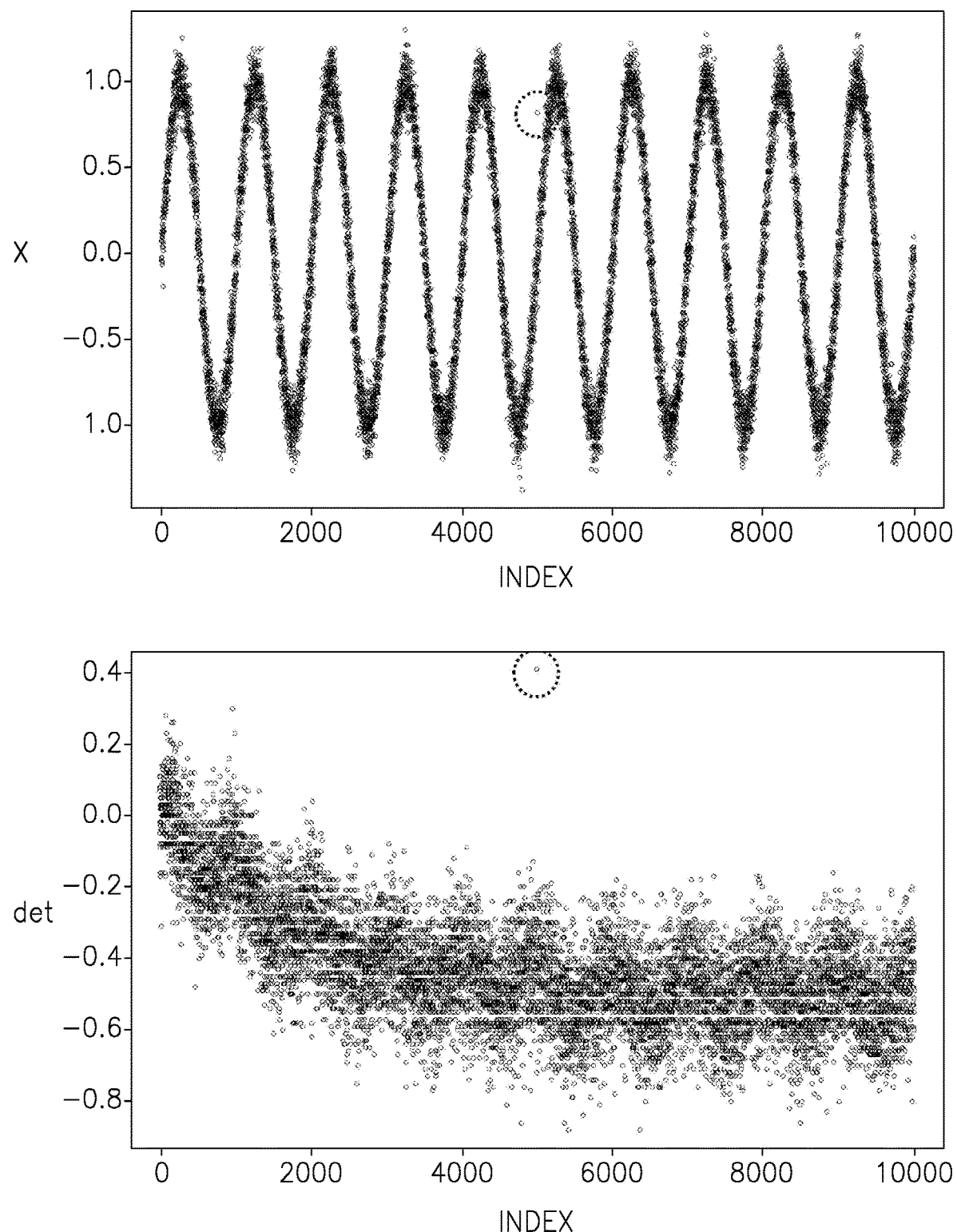
FIG. 10A shows graphs of a first simulation of electrical connection integrity detection circuit performance.
Figure 10B:
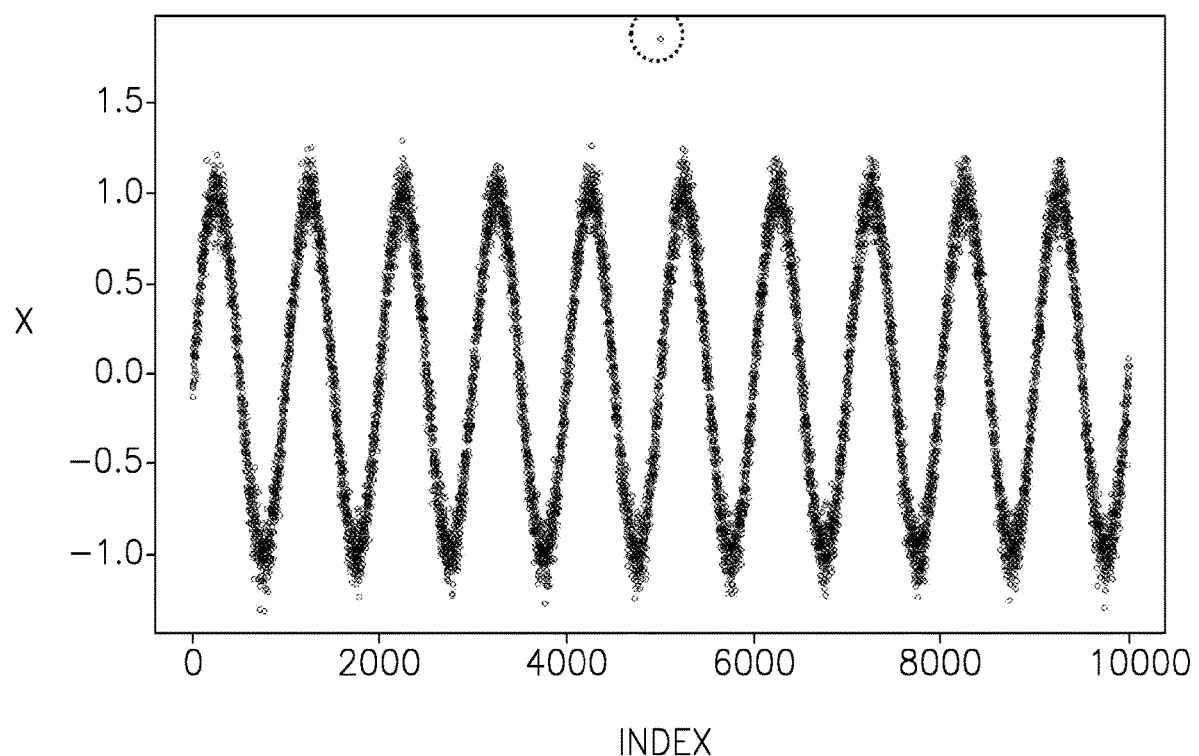
FIG. 10B shows graphs of a second simulation of electrical connection integrity detection circuit performance.
Figure 10B:
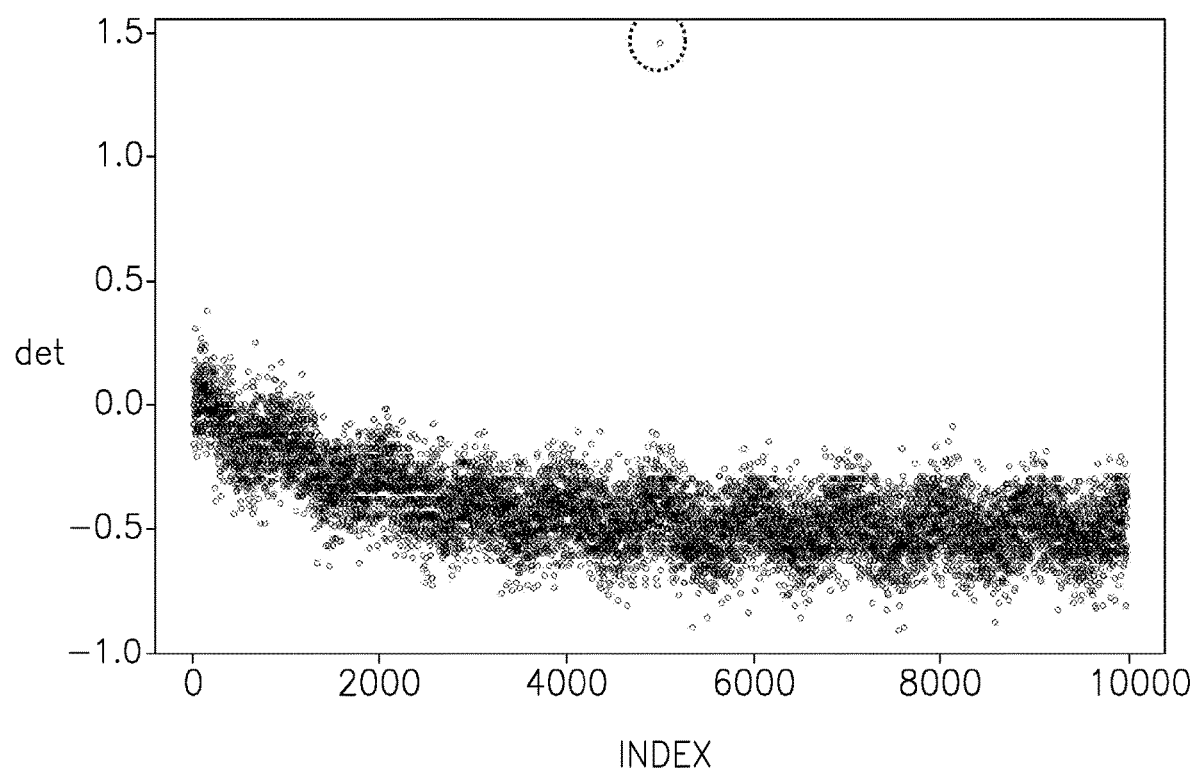

Reference is now made to FIG. 10A and FIG. 10B, which show graphs of a first and second simulations of electrical connection integrity detection circuit performance. The two simulations show the detection of an intermittent disconnection in the signal and the detection circuit signal as shown by a dashed circle surrounding the anomaly.

Throughout this application, various embodiments of this invention may be presented in a range format. It should be understood that the description in range format is merely for convenience and brevity and should not be construed as an inflexible limitation on the scope of the invention. Accordingly, the description of a range should be considered to have specifically disclosed all the possible subranges as well as individual numerical values within that range. For example, description of a range such as from 1 to 6 should be considered to have specifically disclosed subranges such as from 1 to 3, from 1 to 4, from 1 to 5, from 2 to 4, from 2 to 6, from 3 to 6 etc., as well as individual numbers within that range, for example, 1, 2, 3, 4, 5, and 6. This applies regardless of the breadth of the range.

Whenever a numerical range is indicated herein, it is meant to include any cited numeral (fractional or integral) within the indicated range. The phrases "ranging/ranges between" a first indicate number and a second indicate number and "ranging/ranges from" a first indicate number "to" a second indicate number are used herein interchangeably and are meant to include the first and second indicated numbers and all the fractional and integral numerals therebetween.

In the description and claims of the application, each of the words "comprise" "include" and "have", and forms thereof, are not necessarily limited to members in a list with which the words may be associated. In addition, where there are inconsistencies between this application and any document incorporated by reference, it is hereby intended that the present application controls.

To clarify the references in this disclosure, it is noted that the use of nouns as common nouns, proper nouns, named nouns, and the/or like is not intended to imply that embodiments of the invention are limited to a single embodiment, and many configurations of the disclosed components can be used to describe some embodiments of the invention, while other configurations may be derived from these embodiments in different configurations.

In the interest of clarity, not all of the routine features of the implementations described herein are shown and described. It should, of course, be appreciated that in the development of any such actual implementation, numerous implementation-specific decisions must be made in order to achieve the developer's specific goals, such as compliance with application- and business-related constraints, and that these specific goals will vary from one implementation to another and from one developer to another. Moreover, it will be appreciated that such a development effort might be complex and time-consuming but would nevertheless be a routine undertaking of engineering for those of ordinary skill in the art having the benefit of this disclosure.

Based upon the teachings of this disclosure, it is expected that one of ordinary skill in the art will be readily able to practice the present invention. The descriptions of the various embodiments provided herein are believed to provide ample insight and details of the present invention to enable one of ordinary skill to practice the invention. Moreover, the various features and embodiments of the invention described above are specifically contemplated to be used alone as well as in various combinations.

Conventional and/or contemporary circuit design and layout tools may be used to implement the invention. The specific embodiments described herein, and in particular the various thicknesses and compositions of various layers, are illustrative of exemplary embodiments, and should not be viewed as limiting the invention to such specific implementation choices. Accordingly, plural instances may be provided for components described herein as a single instance.

While circuits and physical structures are generally presumed, it is well recognized that in modern semiconductor design and fabrication, physical structures and circuits may be embodied in computer readable descriptive form suitable for use in subsequent design, test or fabrication stages as well as in resultant fabricated semiconductor integrated circuits. Accordingly, claims directed to traditional circuits or structures may, consistent with particular language thereof, read upon computer readable encodings (which may be termed programs) and representations of same, whether embodied in media or combined with suitable reader facilities to allow fabrication, test, or design refinement of the corresponding circuits and/or structures. Structures and functionality presented as discrete components in the exemplary configurations may be implemented as a combined structure or component. The invention is contemplated to include circuits, systems of circuits, related methods, and computer-readable (medium) encodings of such circuits, systems, and methods, all as described herein, and as defined in the appended claims. As used herein, a computer readable medium includes at least disk, tape, or other magnetic, optical, semiconductor (e.g., flash memory cards, ROM), or electronic medium and a network, wireline, wireless or other communications medium.

The foregoing detailed description has described only a few of the many possible implementations of the present invention. For this reason, this detailed description is intended by way of illustration, and not by way of limitations. Variations and modifications of the embodiments disclosed herein may be made based on the description set forth herein, without departing from the scope and spirit of the invention. It is only the following claims, including all equivalents, which are intended to define the scope of this invention. In particular, even though the preferred embodiments are described in the context of a PLL operating at exemplary frequencies, the teachings of the present invention are believed advantageous for use with other types of circuitry in which a circuit element, such as an inductor, may benefit from electromagnetic shielding. Moreover, the techniques described herein may also be applied to other types of circuit applications. Accordingly, other variations, modifications, additions, and improvements may fall within the scope of the invention as defined in the claims that follow.

Embodiments of the present invention may be used to fabricate, produce, and/or assemble integrated circuits and/or products based on integrated circuits.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

The flowchart and block diagrams in the figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application, or technical improvement over technologies found in the marketplace, or to enable others of ordinary skill in the art to understand the embodiments disclosed herein.

What is claimed is:

1. An integrated circuit (IC) comprising:
   a time-to-digital converter (TDC) configured to measure an input-to-output delay of an I/O buffer of a pad the IC, the measured delay reflecting a connection impedance of the pad; and
   a circuit configured to determine electrical connection integrity of the pad, based on the measurement by the TDC.

2. The IC of claim 1, wherein the circuit is configured to determine the integrity based on a comparison between a value of the measured input-to-output delay and a threshold.

3. The IC of claim 2, further comprising:
   a processing component configured to determine the threshold by analyzing values of the measured input-to-output delay during initial operation of the IC.

4. The IC of claim 2, wherein the threshold is received from an external testing circuit.

5. The IC of claim 2, further comprising an environmental condition sensor, wherein the threshold is varied respective of an environmental condition measured by the environmental condition sensor.

6. The IC of claim 5, wherein the environmental condition sensor comprises at least one of: a temperature sensor or a voltage sensor.

7. The IC of claim 2, wherein the circuit comprises a comparator.

8. The IC of claim 1, wherein the circuit is configured to determine the integrity based on a comparison between (a) a difference between two values of the measured input-to-output delay, and (b) a threshold.

9. The IC of claim 8, further comprising:
a processing component configured to determine the threshold by analyzing values of the measured input-to-output delay during initial operation of the IC.

10. The IC of claim 8, wherein the threshold is received from an external testing circuit.

11. The IC of claim 8, further comprising an environmental condition sensor, wherein the threshold is varied respective of an environmental condition measured by the environmental condition sensor.

12. The IC of claim 11, wherein the environmental condition sensor comprises at least one of: a temperature sensor or a voltage sensor.

13. The IC of claim 9, wherein the circuit comprises a comparator.

14. The IC of claim 1, further comprising a lane remapping mechanism configured, in a data path affected by low electrical connection integrity, to:
remap signals from a failed circuit to a circuit which has not failed; and
consequently remap signals associated with other circuits.

15. The IC of claim 14, wherein the lane remapping mechanism is configured with a writable register or a cuttable eFuse.

16. A method comprising:
operating a time-to-digital converter (TDC) comprised in an integrated circuit (IC) to measure an input-to-output delay of an I/O buffer of a pad the IC, the measured delay reflecting a connection impedance of the pad; and
determining electrical connection integrity of the pad, based on the measurement.

17. The method of claim 16, further comprising:
determining the integrity based on a comparison between a value of the measured input-to-output delay and a threshold, wherein the threshold is at least one of:
a threshold determined based on an analysis of values of the measured input-to-output delay during initial operation of the IC,
a threshold received from an external testing circuit, or
a threshold varied respective of an environmental condition in the IC, the environmental condition selected from the group consisting of temperature and voltage.

18. The method of claim 17, wherein the comparison is performed by a comparator comprised in the IC.

19. The method of claim 16, further comprising:
determining the integrity based on a comparison between (a) a difference between two values of the measured input-to-output delay, and (b) a threshold, wherein the threshold is at least one of:
a threshold determined based on an analysis of values of the measured input-to-output delay during initial operation of the IC,
a threshold received from an external testing circuit, or
a threshold varied respective of an environmental condition in the IC, the environmental condition selected from the group consisting of temperature and voltage.

20. The method of claim 19, wherein the comparison is performed by a comparator comprised in the IC.

21. The method of claim 16, further comprising, in a data path of the IC, the data path affected by low electrical connection integrity:
remapping signals from a failed circuit to a circuit which has not failed; and
consequently remapping signals associated with other circuits.

22. The method of claim 21, wherein the two remapping steps utilize a writable register or a cuttable eFuse.

* * * * *